United States Patent
Hsu et al.

(10) Patent No.: US 7,908,423 B2
(45) Date of Patent: Mar. 15, 2011

(54) MEMORY APPARATUS, AND METHOD OF AVERAGELY USING BLOCKS OF A FLASH MEMORY

(75) Inventors: Hung-Jung Hsu, Fen-Shan (TW); Hsiao-Te Chang, Taoyuan (TW)

(73) Assignee: Silicon Motion, Inc., Jhubei (TW)

( * ) Notice: Subject to any disclaimer, the term of this patent is extended or adjusted under 35 U.S.C. 154(b) by 458 days.

(21) Appl. No.: 11/972,658

(22) Filed: Jan. 11, 2008

(65) Prior Publication Data

US 2009/0119448 A1    May 7, 2009

Related U.S. Application Data (60) Provisional application No. 60/951,794, filed on Jul. 25, 2007.

(51) Int. Cl.
*G06F 12/00* (2006.01)
(52) U.S. Cl. .. 711/100; 711/103; 711/154; 711/E12.001
(58) Field of Classification Search .................. 711/103, 711/100, 154, E12.001
See application file for complete search history.

(56) References Cited

U.S. PATENT DOCUMENTS

| | | | |
|---|---|---|---|
| 6,081,447 A | 6/2000 | Lofgren et al. | |
| 6,230,233 B1 | 5/2001 | Lofgren et al. | |
| 6,587,915 B1 * | 7/2003 | Kim | 711/103 |
| 6,594,183 B1 | 7/2003 | Lofgren et al. | |
| 6,742,078 B1 * | 5/2004 | Chien et al. | 711/103 |
| 6,850,443 B2 | 2/2005 | Lofgren et al. | |
| 2003/0227804 A1 | 12/2003 | Lofgren et al. | |
| 2005/0114589 A1 | 5/2005 | Lofgren et al. | |

OTHER PUBLICATIONS

Chinese Office Action dated Jan. 29, 2010 issued in related Chinese Patent Application No. 2008101273744.

* cited by examiner

*Primary Examiner* — Yong Choe
(74) *Attorney, Agent, or Firm* — Grossman, Tucker, Perreault & Pfleger, PLLC (57) ABSTRACT

A flash memory controller for averagely using blocks of a flash memory and the method thereof are provided. The flash memory controller is configured to process wear-leveling by allocating frequently updated data in less-erased blocks, and, allocating less-updated data in frequently erased blocks to achieve dynamic uniformity of times of erasion of blocks.

16 Claims, 6 Drawing Sheets

MEMORY APPARATUS, AND METHOD OF AVERAGELY USING BLOCKS OF A FLASH MEMORY

This application claims the benefit of priority based on U.S. Provisional Application No. 60/951,794 filed on Jul. 25, 2007.

CROSS-REFERENCES TO RELATED APPLICATIONS

Not applicable.

BACKGROUND OF THE INVENTION

1. Field of the Invention

The present invention relates to a flash memory controller. More particularly, the present invention relates to a flash memory controller for averagely using blocks of a flash memory and the method thereof.

2. Descriptions of the Related Art

Portable memories are widely applied in many applications. However, there are several natural properties that limit fields of application. Taking flash memory as an example, the basic access unit is denoted as block, and a block with data (denoted as written block) cannot directly be over-written new data but needs to be erased first. In other words, only empty/erased block can be written. If the previous written block with first logical address is going to be written with new data, the coming new data is written to a spare block, and the spare block with the new data is reassigned with the first logical address. Then the previous written block is erased to be a spare block. The aforementioned operation is denoted as "hot-zone change", in which hot-zone means a number of blocks that are going to be changed at a time, and the hot-zone of written blocks going to be re-written and the hot-zone of spare blocks going to receive new data are equal.

Also, each block of a flash memory has limitation of erase times. For example, one block may be erased for ten thousands times, then the block is unavailable for further erasing and writing new data into, i.e. the block is now failed. When the flash memory starts to have failed block, it may only be read or it may just malfunction, regardless whether it has any other good blocks. Generally, the erase limitation times of single-level-cell flash memory is one hundred thousand erase times, and that of multi-level-cell flash memory is only ten thousand erase times.

Conventional flash memory comprises a various number of blocks, such as 1024 blocks, 2048 blocks, and etc. Prior art of managing the blocks renders all blocks of the flash memory into several management units that averagely have the blocks. Each management unit has two kinds of regions, one is data region, and the other is spare regions. Data region is configured to correspond to logic addresses assigned by a host, and the logic address may be assigned in CHS mode or LBA mode. Spare region is configured to provide spare blocks for replacing the written block in the data regions when new data are going to be written into the flash memory. Since the management unit has the spare region, it can be understood that capacity of each management unit is larger than the capacity of the logic addresses that management unit corresponds to.

It is easy to understand that when the host frequently and extremely access some particular logic addresses, the blocks corresponding to the particular logic addresses and the spare blocks being provided for replacing would have extremely increasing times of erasion. It results in non-uniform times of erasion of the blocks.

Therefore, the memory industry needs a way to manage the use of data blocks and spare blocks to achieve averagely use of blocks. The industry also needs a solution that can manage the data blocks and the spare blocks low-costly.

SUMMARY OF THE INVENTION

The primary objective of this invention is to provide a flash memory controller for averagely using blocks of a flash memory and the method thereof. The flash memory controller is configured to process wear-leveling by allocating frequently updated data in less-erased blocks, and, allocating less-updated data in frequently erased blocks to achieve dynamic uniformity of times of erasion of blocks.

To achieve the objective, the flash memory controller comprises a weight calculation module to calculate hot-zone change between the data blocks and the spare blocks. The flash memory controller also comprises a spare region monitor module to monitor usage of the spare blocks, it monitors using times and sequence of the spare blocks and presents in a usage value. When the usage value is against the weight, the flash memory controller starts to process wear-leveling.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

The present invention provides a method of averagely using blocks of a flash memory. It is so-called method of wear-leveling. The present invention is designed to allocate frequently updated data in less-erased blocks, and, allocate less-updated data in frequently erased blocks to achieve dynamic uniformity of erase times of blocks. The present invention provides a method of dynamically renew usage of spare blocks to achieve wear-leveling with low cost.

Figure 1:
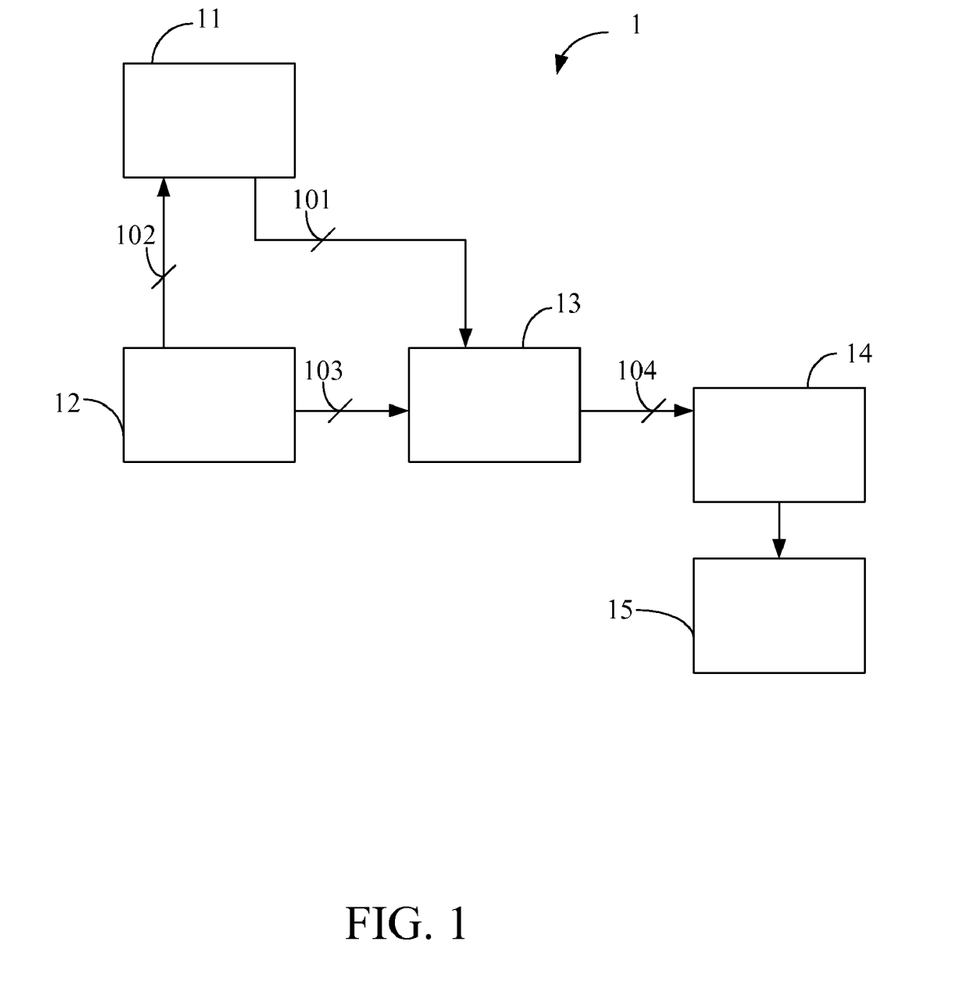
FIG. 1 is a block diagram of a controller 1 of the present invention.

FIG. 1 illustrates a block diagram of a controller 1 of the present invention. The controller 1 is comprised in a memory apparatus comprising a flash memory that receives control signal from the controller 1. The flash memory comprises a data region having a plurality of data blocks and a spare region having a plurality of spare blocks. The controller 1 is configured to establish a record sequence to record a pre-determined erasing/writing sequence of the spare blocks and a erased/written sequence of the spare blocks, and activate a wear-leveling process according to the record sequence. The controller 1 comprises a weight calculation module 11, a spare region monitor module 12, an activation module 13, a non-hot-zone selection module 14, and a block change module 15.

The weight calculation module 11 is configured to calculate urgency of activating wear-leveling and generate a weight 101. Detailed description of an example of the weight calculation module 11 is as follows. In the beginning, an original weight is a multiple of capacity of the spare region. For example, if the capacity of the spare region is 32 blocks, then the original weight may be 32, 64, or other multiple of 32. After the flash memory is used, the weight calculation module 11 starts to calculate hot-zone change between the data blocks and the spare blocks, once the hot-zone is related to large number of blocks per time, which means the blocks are uniformly used, and the weight calculate module 11 increases the weight 101 to ensure late-activate wear-leveling. Otherwise, the weight calculation module 11 decreases the weight to ensure early-activate wear-leveling. In late-activate wear-leveling situation, large hot-zone is presented, that means more number of blocks in data region and spare region are applied for change per time, and results in more uniform use of blocks. In early-activate wear-leveling situation, small hot-zone is presented, that results in less uniform use of blocks of the flash memory, and wear-leveling needs to be activated earlier.

The spare region monitor module 12 is configured to monitor usage of the spare blocks, it monitors using frequency and sequence of the spare blocks and generates a usage value 102 and a reuse value 103. More specifically, the spare region monitor module 12 is configured to establish the record sequence, sequentially write data to the spare blocks according to the pre-determined erasing/writing sequence, and generate a usage value and a reuse value according to the erased/written sequence.

The usage value 102 represents how frequently the spare blocks are accessed, and the reuse value 103 represents reusing times of a particular spare block. That is, the usage value 102 contains information of a repeating frequency of any spare block in the erased/written sequence, and the reuse value 103 contains information of reusing times of a particular spare block in the erased/written sequence. The usage value 102 is then provided to the weight calculation module 11 for updating the weight 101 to ensure late-activate wear-leveling or early-activate wear-leveling. The weight calculation module 11 then adjusts the weight 101 higher when the usage value 102 contains the information representing the repeating frequency is smaller than a reference value. The reuse value 103 to the activation module 13. The spare region monitor module 12 establishes a record sequence to record a pre-determined erasing/writing sequence of the spare blocks and a erased/written sequence of the spare blocks. The record sequence has a capacity that is larger than the number of the spare blocks. Before the flash memory is used, the erased/written sequence is empty. The spare region monitor module 12 sequentially records the erased/written spare block to the record sequence, and cleans the earliest erased/written spare block from the record sequence when the capacity of the spare region monitor module 12 is full.

Figure 2:
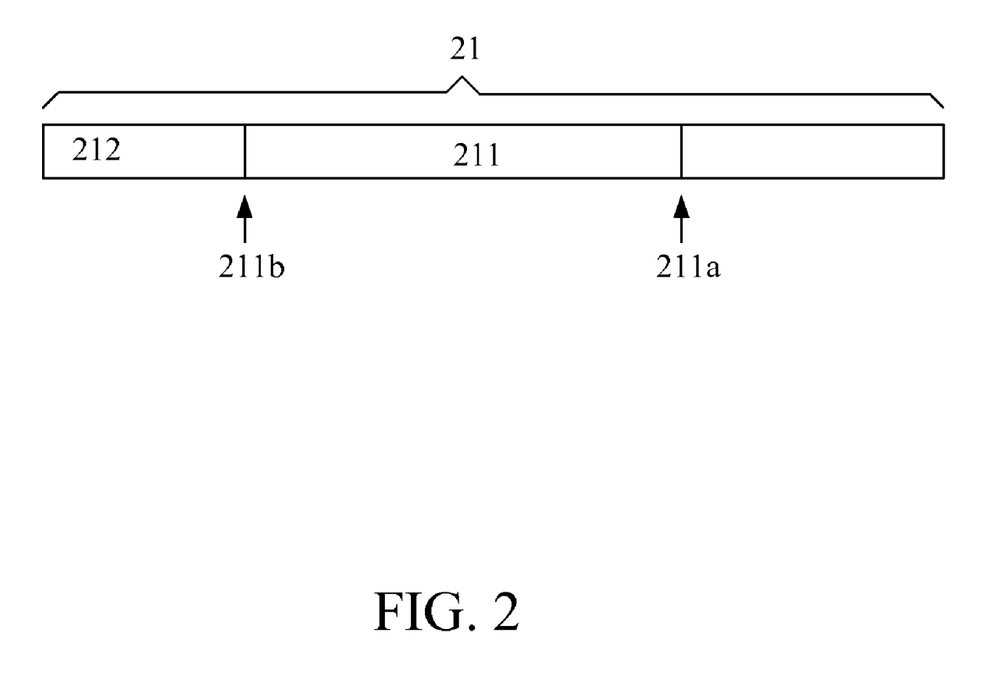
FIG. 2 is a diagram of a record sequence of the present invention.

Referring to FIG. 2, it illustrates the record sequence 21. The record sequence 21 comprises the pre-determined erasing/writing sequence 211 and the erased/written sequence 212. The pre-determined erasing/writing sequence 211 has a capacity for a number of blocks to be placed sequentially, a push-in mark 211a being located at the tail of the pre-determined erasing/writing sequence 211, and a pop-out mark 211b being located at the head of the pre-determined erasing/writing sequence 211. The record sequence 21 has a capacity that is larger than the capacity of the pre-determined erasing/writing sequence 211.

The controller 1 is configured to provide at least one spare block from the pre-determined erasing/writing sequence 211 for being written data according to the capacity of the writing data, move the pop-out mark 211b just after the at least one spare block for being written, move at least one data block being erased into the spare region as at least one spare block, and move the push-in mark 211a to keep the pre-determined erasing/writing sequence 211 in the length.

Figure 3A:
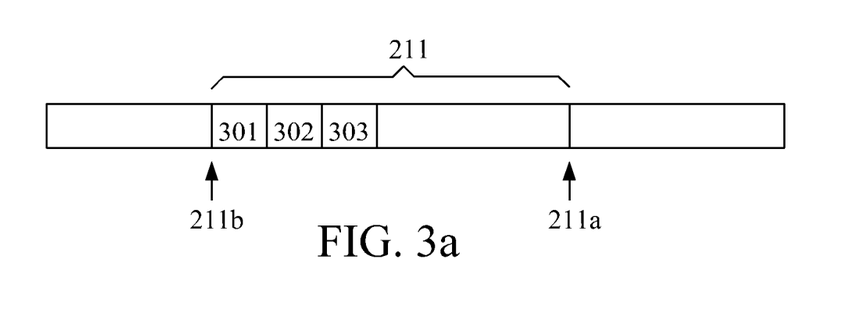
FIGS. 3a-3d are diagrams of operation of the record sequence.
Figure 3B:
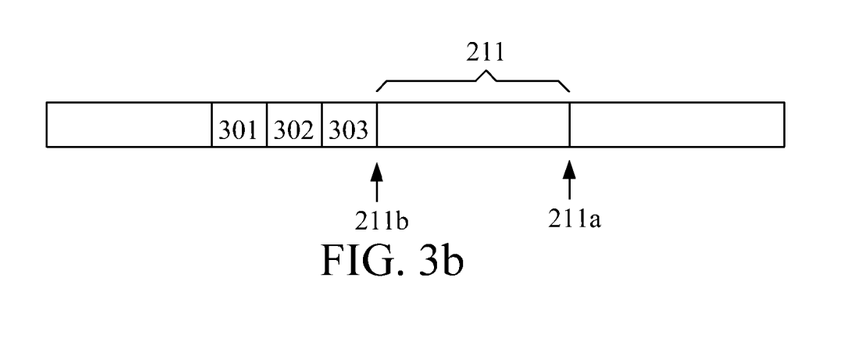
Figure 3C:
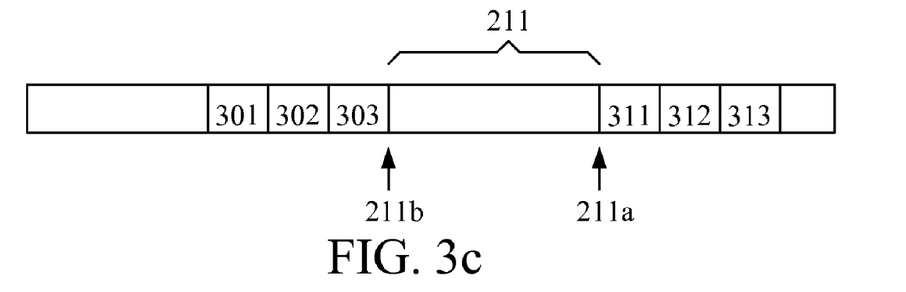
Figure 3D:
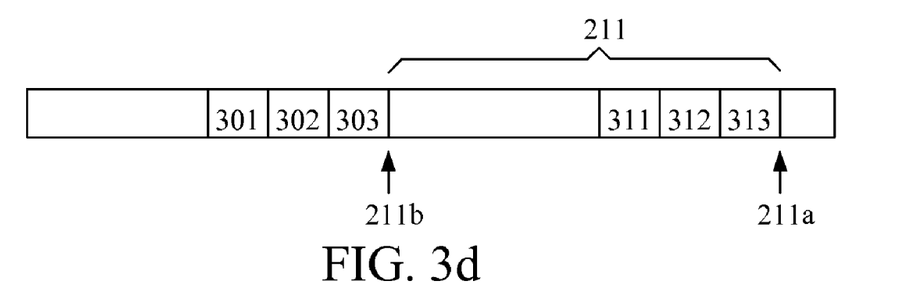

Referring to FIGS. 3a-3d, it illustrates operation of the record sequence 21. The spare blocks in the pre-determined erasing/writing sequence 211 are provided for being written data according to the capacity of the writing data. In FIG. 3a, the pre-determined erasing/writing sequence 211 reserves three spare blocks 301, 302, and 303 for being written. Then, as shown in FIG. 3b, the spare region monitor module 12 moves the pop-out mark 211b just after the three spare blocks 311-303, which means the three spare blocks 301-303 are moved out from the pre-determined erasing/writing sequence 211 and the three spare blocks 301-303 are written with data and assigned with new logic addresses. Then, as shown in FIG. 3c, three data blocks 311, 312, 313 are erased and moved into the spare region as spare blocks. Then, as shown in FIG. 3d, the push-in mark 211a is moved to keep the pre-determined erasing/writing sequence 211 in the length as shown in FIG. 3a.

The activation module 13 is configured to activate the wear-leveling process according to the reuse value 103 and the weight 101 and generating an output signal for wear-leveling. More specifically, the activation module 13 compares the weight 101 from the weight calculation module 11 with the reuse value 103 from the spare region monitor module 12, once the reuse value 103 is against the weight 101, the activation module 13 generates an output signal 104 for activating wear-leveling. In one embodiment, when the reuse value 103 represents a repeating frequency of any spare block in the erased/written sequence being equal to the weight 101, the activation module 13 generates the output signal 104 for activating wear-leveling.

The non-hot-zone selection module 14 is configured to select non-hot-zone blocks for wear-leveling according to the output signal 104 of the activation module 13. If the blocks are never been used, this kind of blocks would be selected as the non-hot-zone blocks first. The non-hot-zone selection module 14 keeps on selecting non-used block until all blocks are at least used once, then the non-hot-zone selection module 14 selects the least used block for wear-leveling. The non-hot-zone blocks can be selected from those blocks that are not in spare region or accessed by the host, or simply selected from the whole blocks. Meanwhile, the non-hot-zone blocks can be selected randomly or sequentially according to the physical or logical arrangement of the blocks.

The block change module 15 is configured to change the selected non-hot-zone blocks that are selected to be changed with the hot-zone blocks needed to be wear-leveled. The block change module 15 renders the logic addresses previously corresponding to the hot-zone blocks to the selected non-hot-zone blocks, and then erases the hot-zone blocks and renders the erased hot-zone blocks as spare blocks. There is an easy way to count times of erasion of every blocks of the flash memory, but it is cost and not practicable.

Figure 4:
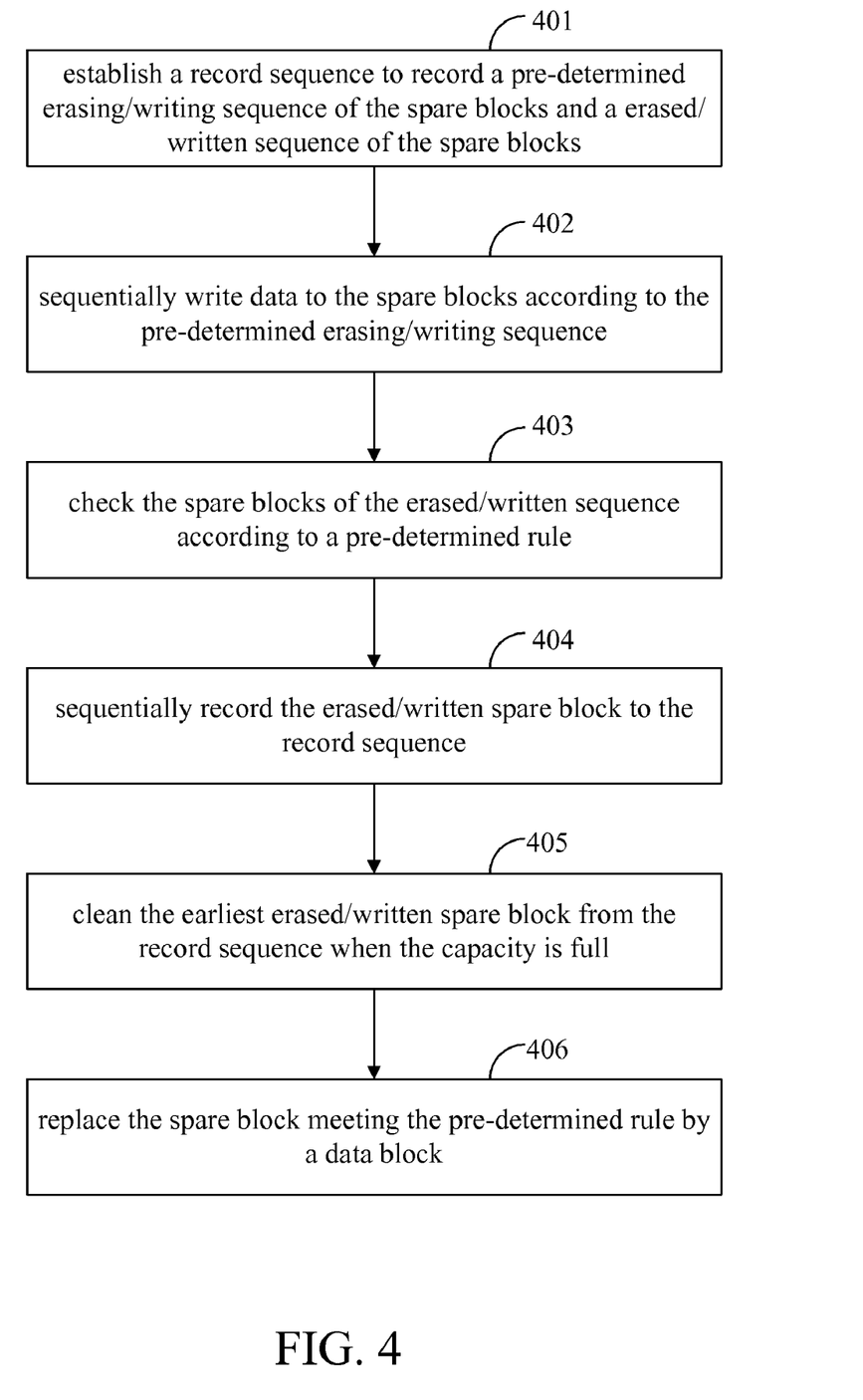
FIG. 4 is a flow chart of an embodiment of the present invention for averagely using blocks of a flash memory.

FIG. 4 illustrates a flow chart of an embodiment of the present invention for averagely using blocks of a flash memory. The flow chart can be applied the aforementioned memory apparatus that comprises a flash memory and a controller. The flash memory comprises a data region and a spare region, the data region having a plurality of data blocks, the spare region having a plurality of spare blocks, the data blocks and the spare blocks having different logic addresses. First, Step 401 is executed to establish a record sequence to record a pre-determined erasing/writing sequence of the spare blocks and a erased/written sequence of the spare blocks. Then Step 402 is executed to sequentially write data to the spare blocks according to the pre-determined erasing/writing sequence. Then Step 403 is executed to check the spare blocks of the erased/written sequence according to a pre-determined rule. Then Step 404 is executed to sequentially record the erased/written spare block to the record sequence. The Step 405 is executed to clean the earliest erased/written spare block from the record sequence when the capacity is full. The capacity of the record sequence is larger than the number of the spare blocks. Then Step 406 is executed to replace the spare block meeting the pre-determined rule by a data block. Then the logic address corresponding to the replaced data block is linked to the spare block meets the pre-determined rule.

It is understood that the flow of the steps is not a limitation of the present invention. For example, Step 404 and Step 405 may be executed after Step 401.

In another embodiment, the pre-determined rule can be a threshold value, in which Step 406 comprises replacing the spare block by a data block when the result of Step 403 represents a repeating frequency of any spare block in the erased/written sequence being equal to the threshold value. The threshold value can be adjustable, and after Step 403 is executed, it further comprises a step of increasing the threshold value when the repeating frequency of any spare block in the erased/written sequence is smaller than a reference value.

Figure 5:
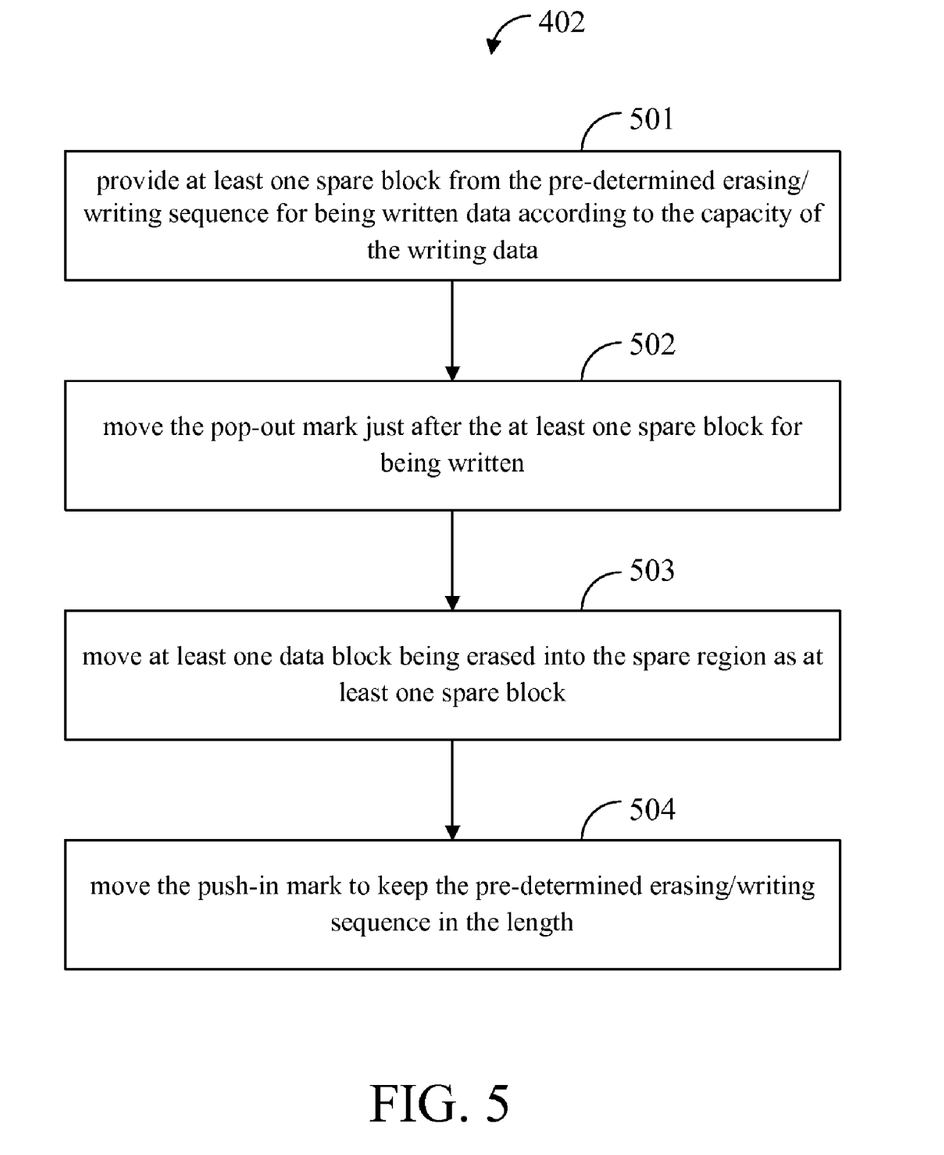
FIG. 5 is a flow char of another embodiment of Step 402 shown in FIG. 4.

In another embodiment, the Step 402 may comprise following steps as shown in FIG. 5. First, Step 501 is executed to provide at least one spare block from the pre-determined erasing/writing sequence for being written data according to the capacity of the writing data. Then, Step 502 is executed to move the pop-out mark just after the at least one spare block for being written. Then, Step 503 is executed to move at least one data block being erased into the spare region as at least one spare block. Then, Step 504 is executed to move the push-in mark to keep the pre-determined erasing/writing sequence in the length. The length of the pre-determined erasing/writing sequence is adapted to contain all the spare blocks of the spare region.

The above disclosure is related to the detailed technical contents and inventive features thereof. People skilled in this field may proceed with a variety of modifications and replacements based on the disclosures and suggestions of the invention as described without departing from the characteristics thereof.

What is claimed is:

1. A method of averagely using blocks of a flash memory, the flash memory comprising a data region and a spare region, the data region having a plurality of data blocks, the spare region having a plurality of spare blocks, the method comprising following steps of:

establishing a record sequence to record a pre-determined erasing and writing sequence of the spare blocks and an erased and written sequence of the spare blocks, wherein the pre-determined erasing and writing sequence has a length, a push-in mark being located at a tail of the pre-determined erasing and writing sequence, and a pop-out mark being located at a head of the pre-determined erasing and writing sequence;

providing at least one spare block from the pre-determined erasing and writing sequence for being written data according to a writing data capacity;

moving the pop-out mark just after the at least one spare block for being written;

moving at least one data block being erased into the spare region as at least one spare block;

moving the push-in mark to keep the pre-determined erasing and writing sequence in the length;

checking the spare blocks of the erased and written sequence according to a pre-determined rule; and replacing the spare blocks meeting the pre-determined rule by at least one of data blocks.

2. The method as claimed in claim 1, wherein the record sequence has a record sequence capacity, and the method further comprises following steps of:

sequentially recording the erased and written spare block to the record sequence; and cleaning the earliest erased and written spare block from the record sequence.

3. The method as claimed in claim 1, the data blocks having corresponding logical addresses, the method further comprising:

linking one logic address corresponding to one of the replaced data blocks to one of the spare blocks meeting the pre-determined rule.

4. The method as claimed in claim 1, wherein the length of the pre-determined erasing and writing sequence is adapted to contain all the spare blocks of the spare region.

5. The method as claimed in claim 1, wherein the pre-determined rule is a threshold value, the replacing step comprises replacing the spare block by a data block when the result of checking step represents a repeating frequency of any spare block in the erased and written sequence being equal to the threshold value.

6. The method as claimed in claim 5, wherein the threshold is adjustable, and after the checking step is executed, the method further comprises following step of:

increasing the threshold value when the repeating frequency of any spare block in the erased and written sequence is smaller than a reference value.

7. The method as claimed in claim 1, wherein the pre-determined rule is a threshold value, and the replacing step comprises replacing the spare block by a data block when the result of checking step represents a repeating frequency of any spare block in the erased and written sequence being equal to the threshold value.

8. The method as claimed in claim 7, wherein the threshold value is adjustable, and after the step of moving the pop-out mark is executed, the method further comprises following step of:

increasing the threshold value when the number of the spare blocks for being written is larger than a reference value.

9. A memory apparatus, comprising:

a flash memory, comprising a data region having a plurality of data blocks and a spare region having a plurality of spare blocks; and a controller, being configured to establish a record sequence to record a pre-determined erasing and writing sequence of the spare blocks and an erased and written sequence of the spare blocks, and activate a wear-leveling process according to the record sequence;

wherein the pre-determined erasing and writing sequence has a length, a push-in mark being located at a tail of the pre-determined erasing and writing sequence, and a pop-out mark being located at a head of the pre-determined erasing and writing sequence, and the controller is configured to provide at least one spare block from the pre-determined erasing and writing sequence for being written data according to a writing data a writing data capacity, move the pop-out mark just after the at least one spare block for being written, move at least one data block being erased into the spare region as at least one spare block, and move the push-in mark to keep the pre-determined erasing and writing sequence in the length.

10. The memory apparatus as claimed in claim 9, wherein the controller comprises a spare region monitor module being configured to establish the record sequence, sequentially write data to the spare blocks according to the pre-determined erasing and writing sequence, and generate a usage value and a reuse value according to the erased and written sequence.

11. The memory apparatus as claimed in claim 10, wherein the reuse value contains information of reusing times of a particular spare block in the erased and written sequence.

12. The memory apparatus as claimed in claim 10, wherein the controller comprises a weight calculation module being configured to generate a weight according to the usage value.

13. The memory apparatus as claimed in claim 12, wherein the controller comprises a activation module being configured to activate the wear-leveling process according to the reuse value and the weight and generating an output signal for wear-leveling.

14. The memory apparatus as claimed in claim 13, wherein the controller comprises a non-hot-zone selection module and a block change module, the non-hot-zone selection module is configured to select non-hot-zone blocks for wear-leveling according to the output of the activation module, the block change module is configured to change hot-zone blocks with the selected non-hot-zone blocks.

15. The memory apparatus as claimed in claim 12, wherein the usage value contains information of a repeating frequency of any spare block in the erased and written sequence.

16. The memory apparatus as claimed in claim 15, wherein the weight calculation module adjusts the weight higher when the usage value contains the information representing the repeating frequency is smaller than a reference value.

* * * * *